United States Patent
Xie et al.

(10) Patent No.: US 10,551,457 B2
(45) Date of Patent: Feb. 4, 2020

(54) METHOD OF GENERATING MULTI-BAND RF PULSES

(71) Applicant: KONINKLIJKE PHILIPS N.V., Eindhoven (NL)

(72) Inventors: Bin Xie, Eindhoven (NL); Arthur Felipe Nisti Grigoletto Borgonovi, Eindhoven (NL); Zhaolin Chen, Eindhoven (NL); Miha Fuderer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 95 days.

(21) Appl. No.: 15/512,085

(22) PCT Filed: Aug. 17, 2015

(86) PCT No.: PCT/EP2015/068812
§ 371 (c)(1),
(2) Date: Mar. 17, 2017

(87) PCT Pub. No.: WO2016/041715
PCT Pub. Date: Mar. 24, 2016

(65) Prior Publication Data
US 2017/0276751 A1 Sep. 28, 2017

(30) Foreign Application Priority Data
Sep. 18, 2014 (EP) ...................................... 14185295

(51) Int. Cl.
*G01R 33/48* (2006.01)
*G01R 33/483* (2006.01)
(Continued)

(52) U.S. Cl.
CPC ....... *G01R 33/4816* (2013.01); *G01R 33/483* (2013.01); *G01R 33/54* (2013.01); *G01R 33/561* (2013.01); *G01R 33/565* (2013.01)

(58) Field of Classification Search
CPC .............. G01R 33/4816; G01R 33/565; G01R 33/561; G01R 33/54; G01R 33/483; G01R 33/4835; G01R 33/5659; G01R 33/543
See application file for complete search history.

(56) References Cited

U.S. PATENT DOCUMENTS

| 5,153,515 A | 10/1992 | Leigh et al. |
| 5,436,600 A | 7/1995 | Van Heteren et al. |

(Continued)

FOREIGN PATENT DOCUMENTS

WO    WO-2012088065 A1 *  6/2012    ......... G01R 33/4835

OTHER PUBLICATIONS

Cunningham C H et al: "Method for Improved Multiband Excitation Profiles Using the Shinnar-Le Roux Transform", Magnetic Resonance in Medicine, John Wiley & Sons, Inc, US, vol. 42, No. 3, Sep. 1, 1999 (Sep. 1, 1999), pp. 577-584.

(Continued)

*Primary Examiner* — Susan S Lee

(57) ABSTRACT

The present invention relates to a method for side-band suppression in a Magnetic Resonance imaging, MRI, system (100), the method comprising providing a first multiband RF pulse for simultaneously exciting at least two slices in a subject (118) at a first and a second frequency band (301, 303) and to acquire using the MRI system (100) signals (307, 308) from the excited two slices and at least one additional signal (309) at a third frequency band (305), the additional signal (309) resulting from a sideband excitation of a slice different from the two slices; using the first multiband RF pulse for determining the additional signal (Continued)

(309); deriving a pre-compensating term from the first multiband RF pulse and the additional signal (309), adding the pre-compensating term to the first multiband RF pulse to obtain a second multiband RF pulse, thereby replacing the first multiband RF pulse by the second multiband RF pulse for suppressing at least part of the additional signal (309).

13 Claims, 5 Drawing Sheets

(51) Int. Cl.
    *G01R 33/54*     (2006.01)
    *G01R 33/561*    (2006.01)
    *G01R 33/565*    (2006.01)

(56) References Cited

U.S. PATENT DOCUMENTS

| | | |
|---|---|---|
| 2011/0267053 A1 | 11/2011 | Li et al. |
| 2012/0223706 A1 | 9/2012 | Hetherington et al. |
| 2014/0167752 A1 | 6/2014 | Hanada et al. |
| 2014/0225612 A1 | 8/2014 | Polimeni et al. |
| 2015/0160313 A1 | 6/2015 | Jesmanowicz |

OTHER PUBLICATIONS

K.J. Lee et al: "Simultaneous multislice imaging with slice-multiplexed RF pulses", Magnetic Resonance in Medicine, vol. 54, No. 4, Sep. 9, 2005 (Sep. 9, 2005), pp. 755-760.

Stephen R. Yutzy et al: "Improvements in multislice parallel imaging using radial CAIPIRINHA", Magnetic Resonance in Medicine, vol. 65, No. 6, Feb. 1, 2011 (Feb. 1, 2001), pp. 1630-1637.

Matthias Honal et al: "Increasing efficiency of parallel imaging for 2D Multislice acquisitions". Magnetic Resonance in Medicine, vol. 61, No. 6, Apr. 13, 2009 (Apr. 13, 2009), pp. 1459-1470.

Felix A. Breuer et al: "Controlled aliasing in parallel imaging results in higher acceleration (CAIPIRINHA) for multi-slice imaging". Magnetic Resonance in Medicine, vol. 53, No. 3, Jan. 1, 2005 (Jan. 1, 2005), pp. 684-691.

Larkman D J et al: "Use of Multicoil Arrays for Separation of Signal from Multiple Slices Simultaneously Excited", Journal of Magnetic Resonance Imaging, Society for Magnetic Resonance Imaging, Oak Brook, IL, US, vol. 13, No. 2, Jan. 1, 2001 (Jan. 1, 2001), pp. 313-317.

Saritas et al "Hadamard Slice Encoding for Reduced Fov Single Shot Diffusion Weighted EPI" Proc. Intl. Soc. Mag. Reson. Med. 17 (2009) p. 1382.

\* cited by examiner

METHOD OF GENERATING MULTI-BAND RF PULSES

CROSS REFERENCE TO RELATED APPLICATIONS

This application is a U.S. national phase application of International Application No. PCT/EP2015/068812, filed on Aug. 17, 2015, which claims the benefit of EP 14185295.4 filed Sep. 18, 2014, EP 15152589.6 filed Jan. 27, 2015, and PCT/CN2015/0761689 filed Apr. 9, 2015, which are incorporated herein by reference.

TECHNICAL FIELD OF THE INVENTION

The invention relates to magnetic resonance imaging, in particular to a method of generating multi-band RF pulses.

BACKGROUND OF THE INVENTION

Multi-band excitation accelerates multi slice magnetic resonance imaging (MRI) scans by exciting and acquiring more than one slice e.g. at the same time. However, due to the RF hardware limitation, multi-band excitations show side-band artefacts in resulting images especially when high frequency modulation multi-band excitations and/or high power scans are used. For example, the side-band artefacts may be the result of spectra or side-band signals that overlap, or fold into, a main lobe.

The US patent application US2011/0267053 concerns a 3D TSE imaging method in which several slabs are scanned in succession such that data are acquired from several slabs within each TR-interval.

The US patent application US2014/0167752 concerns an UTE sequence that uses a half-RF pulse and in which side lobe signals are cancelled out by adding positive and negative gradient pulses.

SUMMARY OF THE INVENTION

Various embodiments provide for an improved method of generating multi-band RF pulses, an improved computer program product an improved magnetic resonance imaging MRI system and an improved RF pulse generator as described by the subject matter of the independent claims. Advantageous embodiments are described in the dependent claims.

In one aspect, the invention relates to a method for side-band suppression in a MRI system. The method comprises providing (step a)) a first multiband RF pulse for simultaneously exciting at least two slices in a subject at a first and a second frequency band and to acquire data using the MRI system signals from the excited two slices and at least one additional signal at a third frequency band, the additional signal resulting from a sideband excitation of a slice different from the two slices. For example, the signals may be magnetic resonance signals that may be simultaneously acquired. A frequency spectrum or frequency profile that indicates the frequency and the amplitude of the signals from the excited two slices may be reconstructed using the acquired signals. The MRI system may comprise a magnet for generating a main magnetic field with an imaging zone, wherein at least part of the subject is within the imaging zone.

The method further comprises using (step b)) the first multiband RF pulse for determining the additional signal in the data; and deriving (step c)) a pre-compensating term from the first multiband RF pulse and the additional signal, adding the pre-compensating term to the first multiband RF pulse to obtain a second multiband RF pulse, thereby replacing the first multiband RF pulse by the second multiband RF pulse for suppressing at least part of the additional signal. Adding may comprise combining the pre-compensating term with the first multi-band RF pulse. Deriving the pre-compensating term from the first multiband RF pulse and the additional signal may comprise deriving the pre-compensating term from the first multiband RF pulse, the amplitude of the additional signal and/or the third frequency band. That is, the invention achieves suppression of at least part of the additional signal upon exciting at least two slices in a subject by the second multiband RF pulse.

The term "determining" refers to prediction, detection, measure, and/or identification.

The excitation may restrict the tipping or excitation of magnetization by the first multi-band RF pulse to certain regions or slices. The "frequency band" refers to the frequency range that maps to slice thickness at a particular location. Multi-band refers to multiple frequency ranges (multi-slice). The term "slice" refers to a region affected by selective and/or refocusing excitation. The term "slice" refers to the physical region or the spatial distribution of magnetization represented by an MR image or spectrum.

These features may have the advantage of providing a preventive method for avoiding or suppressing unintentionally excited slices. In other terms, the present method may provide an a priori correction of the side-bands that result from the unintentionally excitation of slices. This may increase the quality of the acquired MR data and may save processing resources that would otherwise be required for a posteriori correction of sidebands in reconstructed images.

According to one embodiment, determining the additional signal comprises exciting the two slices using the first multiband RF pulse; reconstructing an image using acquired MR data for the two slices in response to the first multiband RF pulse; and identifying using the reconstructed image the additional signal. The features of this embodiment may be performed during a calibration scan of the MRI system. The calibration scan is typically carried out prior to a diagnostic scan of the subject. This embodiment may have the advantage of providing an accurate method for identifying the additional signals (also referred to herein as side-band signals or side lobes or side lobe signals).

According to one embodiment, the MRI system comprises an RF amplifier for amplifying RF pulses generated at the MRI system, wherein determining the additional signal comprises: exciting the two slices using the first multiband RF pulse; receiving the first multiband RF pulse as an output of the RF amplifier or as an output of an RF coil of the MRI system; applying a Fourier transformation or a Block simulation to the received first multiband RF pulse for obtaining a frequency spectrum of the received first multiband RF pulse; and identifying the additional signal in the frequency spectrum. For example, the RF amplifier and/or the RF coil may be configured to send their output (RF pulse) to an RF pulse generator of the MRI system that identifies the additional signal. The features of this embodiment may be performed during a calibration scan or during a diagnostic scan. For example, during the diagnostic scan, the MRI system may be controlled such that the second multiband RF pulse is applied after replacing the first multiband RF pulse i.e. the first multiband RF pulse may not be applied. This method may prevent fully running the MRI system (e.g. without exciting the slices and reconstructing the images) in order to identify the additional signals.

According to one embodiment, determining the additional signal comprises receiving from a user of the MRI system data indicative of the additional signal being a sideband signal at the third frequency band. For example, the reception of data may occur in response to prompting the user for indicating additional signals that may result from the application of the first multi-band RF pulse.

According to one embodiment, determining the additional signal comprises providing history data indicative of one or more multiband RF pulses and associated frequency spectrums; identifying a multiband RF pulse of the one or more multiband RF pulses that corresponds to the first multiband RF pulse; and identifying the additional signal using the frequency spectrum associated with the identified multiband RF pulse. For example, the second multiband RF pulse may be selected as a multiband RF pulse of the one or more multiband RF pulses whose associated frequency spectrum corresponds to the expected frequency spectrum of the first multiband RF pulse having no additional signals. This embodiment may have the advantage of providing an automatic method for identifying the additional (side-band) signal.

According to one embodiment, identifying comprises: determining the geometry or the size of the subject; using the determined geometry or size for determining a circumference area around the first and second frequency bands in the frequency spectrum; identifying the additional signal within the circumference area. The geometry or the size of the subject that is determined comprises the geometry of the size of the portion of the subject that is imaged e.g. that is inside an imaging zone of the MRI system. This may provide an efficient method for suppressing only side-band signals that may affect the desired image. For example, a side-band signal that may not induce an artifact effect in an image area that covers the portion of the subject that has been imaged may not be treated or identified.

According to one embodiment, the first multiband RF pulse is defined as $Ae^{i(\Phi+2\pi ft)}+Ae^{i(\Phi-2\pi ft)}=Ae^{i\Phi}\cdot 2\cdot\cos(2\pi f\cdot t)$, wherein the second multiband RF pulse is defined as $Ae^{i\Phi}\cdot(2\cdot\cos(2\pi f\cdot t)-h(f,t))$ where $$Ae^{i\Phi}\cdot h(f,t)=Ae^{i\Phi}\cdot\Sigma_{k=1}^{N}s_k\cos((k)\cdot 2\pi f\cdot t+\phi_k)$$

is the pre-compensating term, sk being a tuning parameter representing the ratio between the amplitude of one of the signals at the first or second frequency band and the amplitude of the additional signal at the (2k+1) frequency band, $\phi_k$ being the phase difference between the additional signal and at one of the signals from the two slices, N determining the number of the at least one additional signal. The amplitude of the signal at a given frequency band may be the amplitude at the center frequency of the given frequency band. In another example, the amplitude of the signal at a given frequency band may be the surface under that signal. The one of the signals at the first or second frequency band may be selected randomly. In another example, the one of the signals at the first or second frequency band may be the signal having a frequency band closer to the third frequency band. In another example, the one of the signals at the first or second frequency band may be the signal having the highest amplitude. For example, the one of the signals at the first or second frequency band and the amplitude of the additional signal at the third frequency band may be normalized (e.g. to the same proton density in the additional slice as well as one of the two slices associated with the one of the of the signals at the first or second frequency band) before performing the ratio of the amplitudes of the normalized signals.

According to one embodiment, the second multiband RF pulse is defined as
$Ae^{i\Phi}\cdot g(f,t)\cdot m(f,t)$ where m(f,t) is a harmonic function, and the Fourier transform of g(f,t) m(f,t) over t gives response close to 1 at f and −f, and close to 0 elsewhere, and $g(f,t)=2\cdot\cos(2\pi f\cdot t)$.

These embodiments may provide alternative methods for determining the precompensating term that may be cross checked against each other.

According to one embodiment, the method further comprises: repeating the determining of the additional signal and the deriving step c) using the second multiband RF pulse as the first multiband RF pulse in step b) until the suppressed at least part of the additional signal is higher than a predetermined minimum side-band signal amplitude. This may have the advantage of further reducing nondesired side lobe or additional signals, for multiple main lobe signals.

According to one embodiment, the method further comprises exciting the two slices using the second multiband RF pulse for reconstructing signals from RF coils of the MRI system, wherein reconstructing a signal from an RF coil of the RF coils is performed in accordance with formula $S_q^*(f^*x)_{q,1}$ where: q refers to a slice of the two slices and the additional slice, $S_q$ is a sensitivity of the RF coil for q, f is the normalized amplitude of the signal at q and x is the signal from q. As there may be still remaining side lobes after performing the first suppression method described by the previous embodiments, the present method may have the advantage of reducing or eliminating the artifacts from images of the main lobes that may be caused by the remaining side lobes. Further, since the main lobe signals are not equal and the difference is reflected in "f" in the reconstruction formula, the differences in the main lobes may also be corrected. For example, the MRI system may comprise at least one RF coil per slice of the two slices and the additional slice. This embodiment may be performed during a physical scan.

In another aspect, the invention relates to a computer program product comprising computer executable instructions to perform the method steps of the method of any one of the preceding embodiments.

In another aspect, the invention relates to a RF pulse generator for a magnetic resonance imaging, MRI, system for side-band suppression, wherein a first multiband RF pulse is provided for simultaneously exciting at least two slices in a subject at a first and a second frequency band and to acquire using the MRI system signals from the excited two slices and at least one additional signal at a third frequency band, the additional signal resulting from a sideband excitation of a slice different from the two slices. The RF pulse generator is configured for using the first multiband RF pulse for determining the additional signal; deriving a pre-compensating term from the first multiband RF pulse and the additional signal, adding the pre-compensating term to the first multiband RF pulse to obtain a second multiband RF pulse, thereby replacing the first multiband RF pulse by the second multiband RF pulse for suppressing at least part of the additional signal.

In another aspect, the invention relates to a MRI system for acquiring magnetic resonance data comprising an RF pulse generator according to the previous embodiment.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

Magnetic resonance image data is defined herein as being the recorded measurements of radio frequency signals emitted by the subject's/object's atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
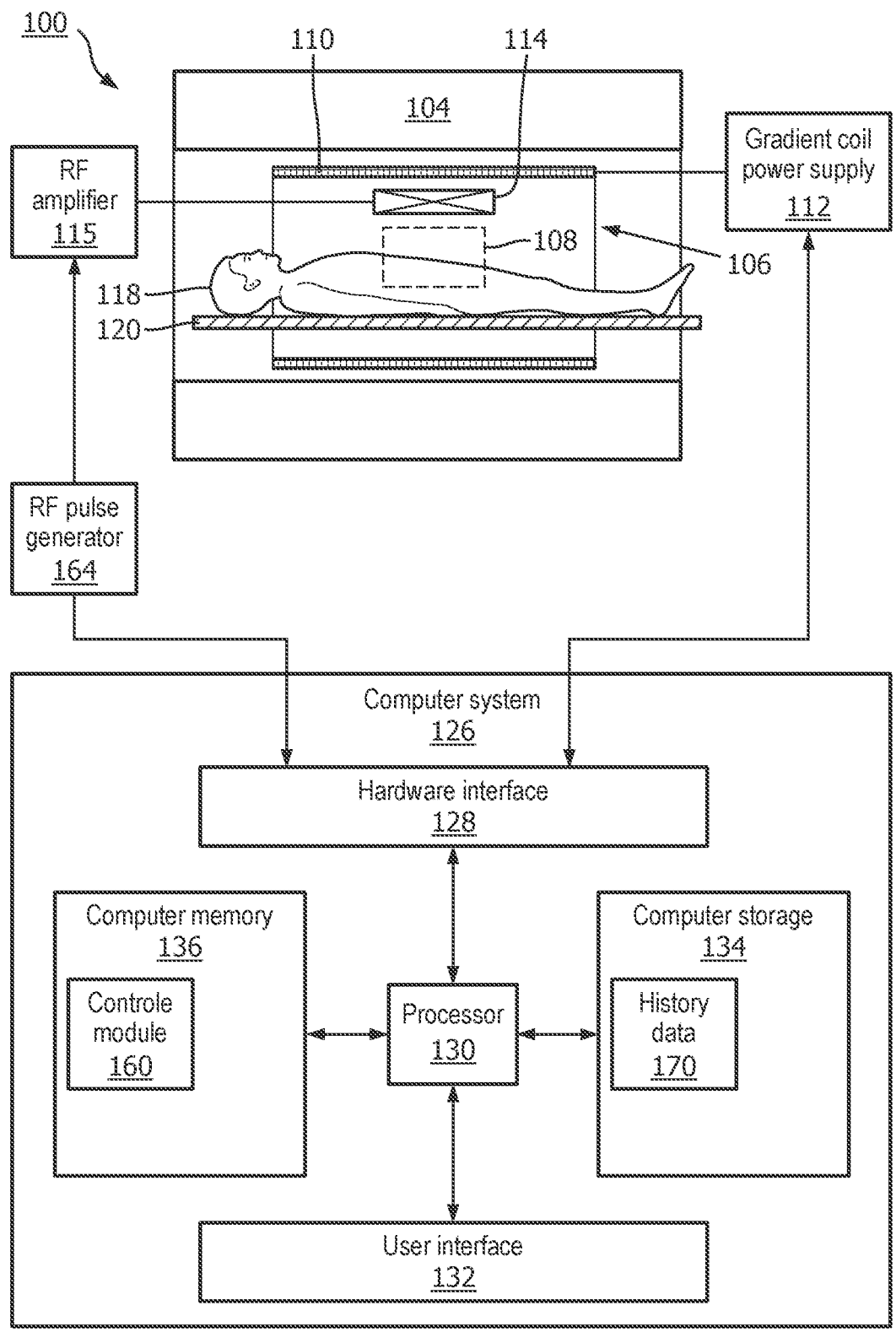
FIG. 1 illustrates a magnetic resonance imaging system.

FIG. 1 illustrates an example of a magnetic resonance imaging system 100. The magnetic resonance imaging system 100 comprises a magnet 104. The magnet 104 is a superconducting cylindrical type magnet 100 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject 118, the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins of a target volume within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

MRI system 100 further comprises an RF transmit coil 114 above the subject 118 and adjacent to the imaging zone 108 for generating RF excitation pulses. The RF transmit coil 114 may include for example a set of surface coils or other specialized RF coils. The RF transmit coil 114 may be used alternately for transmission of RF pulses as well as for reception of magnetic resonance signals e.g., the RF transmit coil 114 may be implemented as a transmit array coil comprising a plurality of RF transmit coils. The RF transmit coil 114 is connected to an RF amplifier 115. The RF amplifier 115 is connected to a RF pulse generator 164. The RF pulse generator 164 may generate a multiband RF pulse for simultaneously exciting multiple slices in the subject 118 e.g. within the imaging zone 108 (e.g. such as the Caipirinha approach).

The magnetic field gradient coil power supply 112 and the RF pulse generator 164 are connected to a hardware interface 128 of computer system 126. The computer system 126 further comprises a processor 130. The processor 130 is connected to the hardware interface 128, a user interface 132, a computer storage 134, and computer memory 136.

The computer memory 136 is shown as containing a control module 160. The control module 160 contains computer-executable code which enables the processor 130 to control the operation and function of the magnetic resonance imaging system 100. It also enables the basic operations of the magnetic resonance imaging system 100 such as the acquisition of magnetic resonance data.

The computer storage 134 is shown as containing history data 170 e.g. in the form of a database indicative of one or more multiband RF pulses and associated frequency spectrums. The frequency spectrum may be the response (e.g. a reconstructed image) of the MRI system 100 to a multiband RF pulse of the one or more multiband RF pulses. The frequency spectrum may be obtained using simulation of the response of the MRI system 100 when the multiband RF pulse is applied. The simulation may be based on a model of the MRI system 100. In another example, the frequency spectrum may be obtained using a calibration or diagnostic scan using the MRI system 100.

In response to applying a multiband RF pulse to the slices, the MRI system 100 may reconstruct a frequency spectrum (or slice profile) comprising signals from the excited slices. However, due to at least the response non-linearity of the RF amplifier 115 and/or the RF transmit coil 114 at least one additional signal (a sideband signal) may be present in the frequency spectrum resulting from an excitation (i.e. a sideband excitation) of a slice different from the slices. It is noted that sideband suppresson according to the present invention is achieved independently of the origin of the unwanted sideband. That is, whatever the cause of the unwanted sidebands, the suppression occurs in the same manner by way of the pre-compensating term. The RF amplifier imperfections are only an example of the cause of the sidebands, but the solution of the invention to suppress them does not depend in the precise origin.

Figure 2:
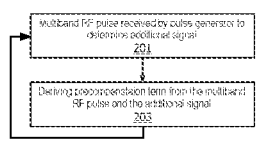
FIG. 2 is a flowchart of a method for avoiding or suppressing a sideband signal.

FIG. 2 is a flowchart of a method for avoiding or suppressing the additional signal. An example of the additional signal 309-312 as well as the signals 307-308 (also referred to as main lobes or main lobe signals) from the intended/desired slices are shown in the slice profile or frequency spectrum 300 of FIG. 3. For the sake of simplicity only two slices are described as being excited by the multiband RF pulse e.g. at a first 301 and a second 303 frequency band. And, the additional signal 309 may result for example from excitation of an additional (non-desired) slice at a third frequency band 305.

The multi-band RF pulse may be obtained as the sum of two individual RF pulses shapes.

$$\text{pulse\#1+pulse\#2: } Ae^{i(\phi+2\pi ft)}+Ae^{i(\phi-2\pi ft)}=Ae^{i\phi}\cdot 2\cdot\cos(2\pi f\cdot t)$$

The multi-band RF pulse may be written as:

$$Ae^{i\phi}\cdot g(f,t)$$

where $Ae^{i\Phi}$ defines the pulse shape and $g(f,t)=2\cdot\cos(2\pi f\cdot t)$ is the frequency modulation function.

In step 201, the multiband RF pulse (i.e. the first multiband RF pulse described above) may be used by the RF pulse generator 164 to determine the additional signal 309-312. Determining the additional signal 309-312 may comprise, for example, predicting the additional signal and/or identifying the additional signal 309-312 e.g. in a frequency spectrum 300 obtained or reconstructed by the MRI system 100 in response to applying the multiband RF pulse.

For example, the determination of the additional signal 309-312 may be performed before running or completing an MRI scan i.e., before exciting the two slices using the MRI system 100. Further details on the methods for determining the additional signal are described with reference to FIGS. 5-6.

The number of the at least one additional signal 309-312 may depend for example on the geometry of the portion of the subject 118 being imaged and/or the amplitude of the additional signal. For example, if the brain is imaged the additional signal may be identified in a circumference region e.g. of few centimeters that matches the geometry or size of the brain. In another example, in FIG. 3 the additional signal 309 may be identified as being close or within the imaged region while the other additional signals 310-312 may not be identified.

In step 203, a pre-compensating term $Ae^{i\Phi}\cdot h(f,t)$ may be derived from the multiband RF pulse $Ae^{i\Phi}\cdot g(f,t)$ and from the additional signal e.g. from the third frequency band 305 and/or amplitude 313 of the additional signal 309. The pre-compensating term may be derived such that when the (modified) multiband RF pulse is applied a resulting pre-compensating signal at the third frequency band 305 is combined such that it cancels out with the additional signal 309 caused by the non-linearity of the RF amplifier 115 and/or the RF coil 114. In this way, the additional signal 309 may be suppressed at least partially. The pre-compensating term may be defined as the following side-band model $Ae^{i\Phi}\cdot h(f,t)=Ae^{i\Phi}\cdot\Sigma_{k=1}^{N}s_k\cos((2k+1)\cdot 2\pi f\cdot t+\phi_k)$ where $s_k$ is a tuning parameter representing the ratio between the amplitude (e.g. the signal intensity or amplitude measured may be related to the square of the xy-magnetization $M_{xy}$) of the main-band e.g. 307 or 308 and the amplitude of the side-band k 309. The amplitude of a signal (e.g. sideband 309 or mainband 307) may comprise the amplitude at the centre frequency band covered by the signal. In another example, the amplitude of the signal may comprise its surface. $(2k+1)f$ gives the side-band frequency for side-band k 309. $\phi_k$ is the phase difference between the side-band k 309 and the main-band 307 or 308. N determines how many side-bands (i.e. additional signals) to be compensated.

Figure 4:
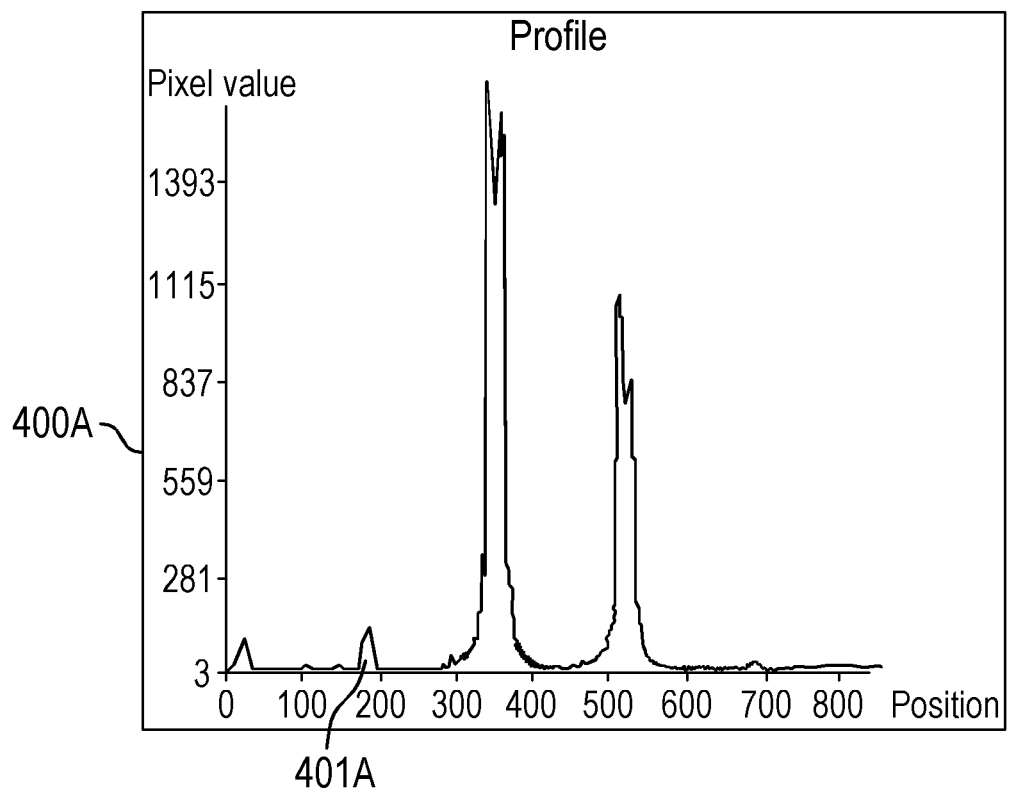
FIG. 4 illustrates a slice profile before and after applying at least part of the present method.
Figure 4:
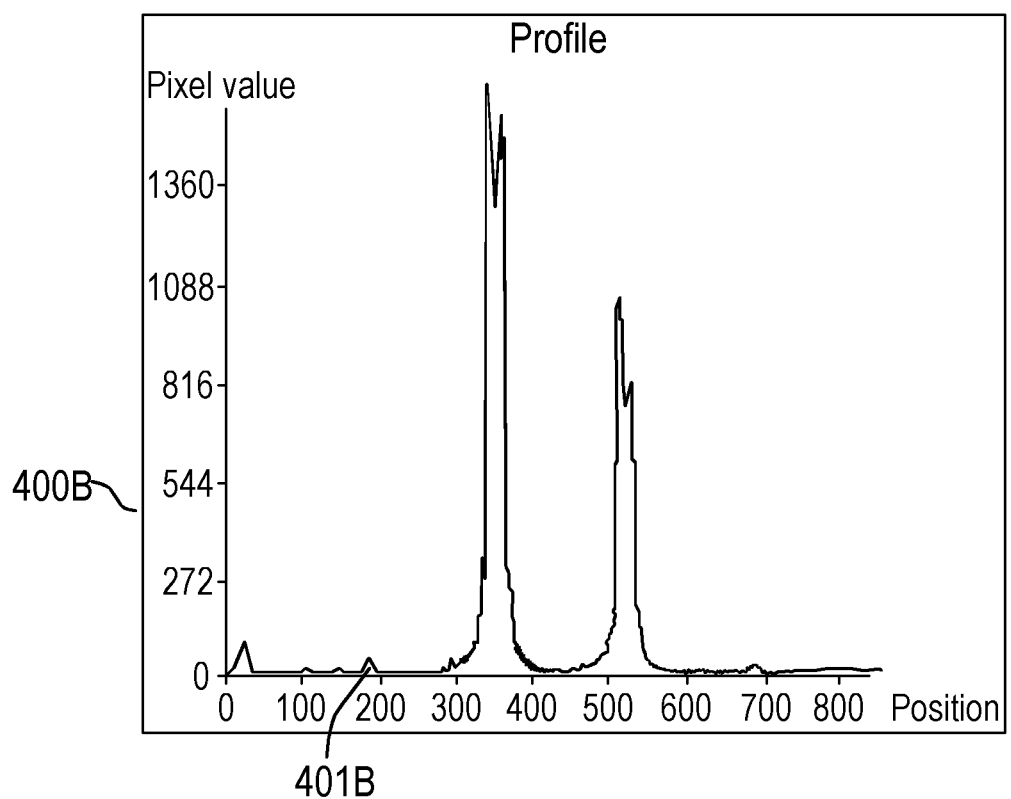

The pre-compensating term $Ae^{i\Phi}\cdot h(f,t)$ may be combined with e.g. subtracted from the multiband RF pulse $Ae^{i\Phi}\cdot g(f,t)$ to obtain a modified multiband RF pulse (i.e. the second multiband RF pulse described above) $Ae^{i\Phi}\cdot(g(f,t)-h(f,t))$. For example, for a subsequent MRI scan, the multiband RF pulse may be replaced by the modified multiband RF pulse for suppressing at least part of the additional signal 309. The result of the present method is shown, for example, in FIG. 4. FIG. 4 shows two spatial spectrums (obtained by a 6 kHz frequency modulation) before 400A and after 400B applying the modified multiband RF pulse. As it is shown in FIG. 4, the identified additional signal 401A is at least partially suppressed when compared to the corresponding signal 401B after the method is applied (i.e. after the modified multiband d RF pulse is applied).

For example, the pre-compensating term may be received by the RF pulse generator 164 in response to prompting a user of the MRI system 100 for modifying the multiband RF pulse. In another example, the pre-compensating term may be empirically obtained by repeated experiments until the desired additional signal suppression is achieved. The repeated experiments may be performed using for example calibration scans with the MRI system 100. In another example, the pre-compensating term may be automatically derived or obtained using the history data; wherein the history data stores or comprises the multiband RF pulse in association with the pre-compensating term.

In another example, the compensating term may be derived as a harmonic function. In this case the modified multiband RF pulse may be defined as $Ae^{i\Phi}\cdot g(f,t)\cdot m(f,t)$, where $m(f,t)$ is a polynomial function, and the Fourier transform of $g(f,t) m(f,t)$ over t gives response close to 1 at f and –f, and close to 0 elsewhere.

In another example of the present disclosure, a method to fix or to avoid the side lobe signals problem by compensating the multiband RF pulse iteratively before imaging sequence starts is herein disclosed. For that, steps 201 and 203 may be repeated until the suppressed at least part the additional signal is higher than a predetermined minimum side-band signal amplitude. For example, the minimum side-band signal amplitude (to be suppressed) may comprise 99% of the additional signal such that the additional signal is completely suppressed. In another example, the minimum side-band signal amplitude maybe 95% of the additional signal. In a first repetition (or iteration) of steps 201 to 203, the second RF pulse of the previous step 203 may be used as the first RF pulse of step 201 of the current repetition or iteration. In this case, the pre-compensating term may be redefined as the following side-band model $$Ae^{i\Phi}\cdot h(f,t)=Ae^{i\Phi}\cdot\Sigma_{k=1}^{N}s_k\cos((k)\cdot 2\pi f\cdot t+\phi_k)$$

Figure 7:
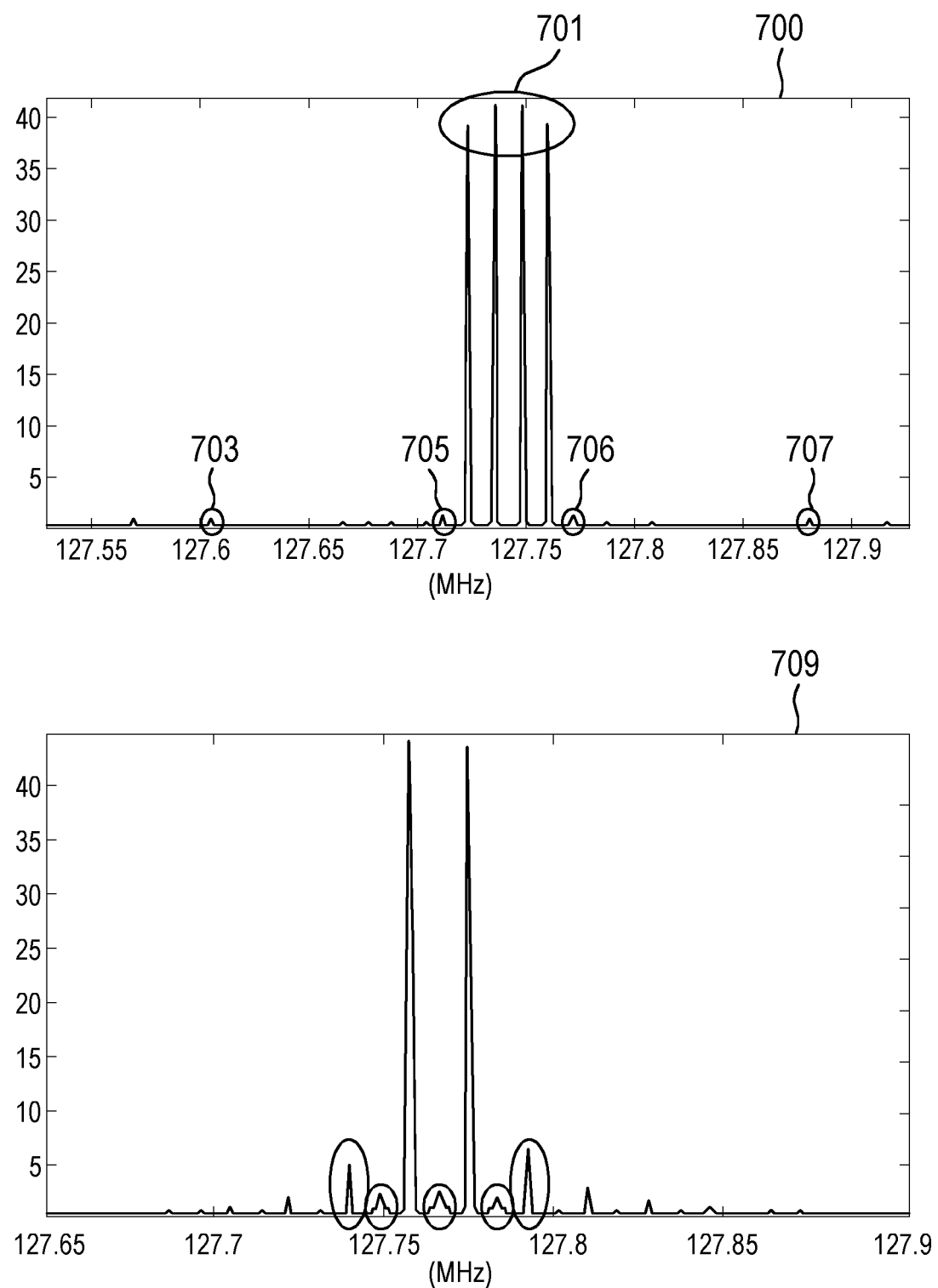
FIG. 7 illustrates a slice profile.

This may suppress side-lobes (i.e. additional signals) at both even and odd side-lobe (as lobes shown in slice profile 709 of FIG. 7) frequencies (±k*f, k=0, 1, 2, 3, etc). This may be particularly advantageous when the multiband RF pulse is intended to excite more than two slices e.g. 4 slices as shown with reference to 4 main lobe signals 701 of FIG. 7. Steps 201-203 (and their repetitions) may be a preparation phase before imaging sequence starts. The preparation phase may for example be a calibration scan or pre-scan for determining imaging conditions and/or data used for image reconstruction etc. that may be used later for the physical scan. The preparation phase may be performed separately from the clinical or main scan. The preparation phase may be performed before the clinical or physical scan. The term physical scan, clinical scan or main scan may refer to a scan for imaging an intended diagnosis image such as a T1 Weighted image.

For example, in this preparation phase, the first multi band RF pulse of step 201 may be sent out and immediately received back from a spectrometer output of the MRI system (TX out) and/or RF amplifier forward ports of the RF amplifier (e.g. 115) for each repetition of steps 201-203. The signal from TX out or RFA forward is used to determine the additional signal or side lobe signals. The difference between the first multiband RF pulse sent to the TX and/or RFA and received pulse or signal from TX and/or RFA may be added to the first multiband RF pulse to form the second multiband RF pulse of step 203.

At the end of the preparation pase, the second multiband RF pulse may be partially or fully compensated in that the additional signal(s) is suppressed at least partially and may be used in imaging sequence.

However, hardware imperfections are sometimes unavoidable and small sidelobes may still remain after the preparation phase. Therefore, in the following it is described a method for unfolding side-lobe slices in image reconstruction e.g. in the physical scan. This method may be applied in combination or in separation from the preparation phase (e.g. this may prevent usage of an iterative image reconstruction).

Figure 3:
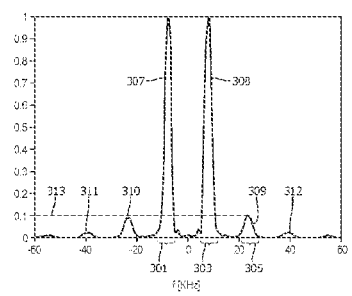
FIG. 3 illustrates a slice profile.

In conventional image reconstruction methods, side-lobes may not be considered in the reconstruction matrix. However, in practice, after the preparation phase, there might still be remaining side lobes, e.g. 4 side lobes (309-312) of FIG. 3. In the case of FIG. 3, if the conventional reconstruction matrix is used, only two images are generated (associated with the main lobes 307-308); however, signals from the 4 side lobes may be embedded in the main lobe images, so artifacts exist.

To account for side-lobes and different flip angles in main-lobes, the reconstruction matrix (or formula) is defined as:

$$S_{c,q} * (f*x)_{q,1} = C_{c1}$$

"1" in the formula means the matrix has only one column, where, q is a number that varies from 1 to the number of main-lobes plus non-negligible side-lobes (i.e. side lobes have amplitudes higher that a predetermined maximum noise amplitude), $S_{c,q}$ is the sensitivity of coil c at slice q. $x_{q,1}$ is spatially dependent signal from slice q, $C_{c,1}$ is the signal in receive coil c. f is used to fix the flip angle differences in all lobes (main and side lobes). "f" is calculated from the RF signal acquired during the preparation phase. f is the normalized measured signal amplitudes of all lobes (main lobes and side lobes) after preparation phase. The normalization is performed with respect to a single value which may for example be the value used to calculate the required flip angle e.g. 1640. In another example, the normalization may be performed with respect to the maximum or the average amplitude of the amplitudes of the main lobe signals and/or the side lobe signals. For example, in case of the slice profile 700 of FIG. 7 that comprises 4 main-lobes 701 and 4 side-lobes 703-707, "f" is an 8 elements array (and q=1, 2, 3 . . . or 8) whose values are the normalized signal amplitudes of signals 701-707.

After the reconstruction is performed, 8 images are generated instead of 4 in the conventional reconstruction. 4 Side lobe signals are reconstructed as 4 individual images and discarded. So the main lobe images are artifacts free. Also, since the main lobe signals are not equal and the difference is reflected in "f" in the reconstruction formula, the differences in the main lobes are also corrected. This may correct for the brightness differences in the 4 main lobes. For example, this may correct unequal amplitudes of two main-lobes in FIG. 4.

Depending on IQ, imaging speed requirement and hardware imperfection severity, pulse pre-distortion or recon fix can be used separately or combined.

By using the revised recon matrix, all slices including side-lobe slices can be unfolded without artifacts as long as the number of coils is more than q. Signal difference due to different flip angles are also corrected by "f".

FIG. 3, shows a slice profile 300 (from simulation data) where for example at 2f=16 kHz, a side band signal of 10% is created. The theoretical or designed slice profile (i.e. without hardware limitation e.g. RF amplifier limitation) would comprise the two signals 307 and 308 only.

Figure 5:
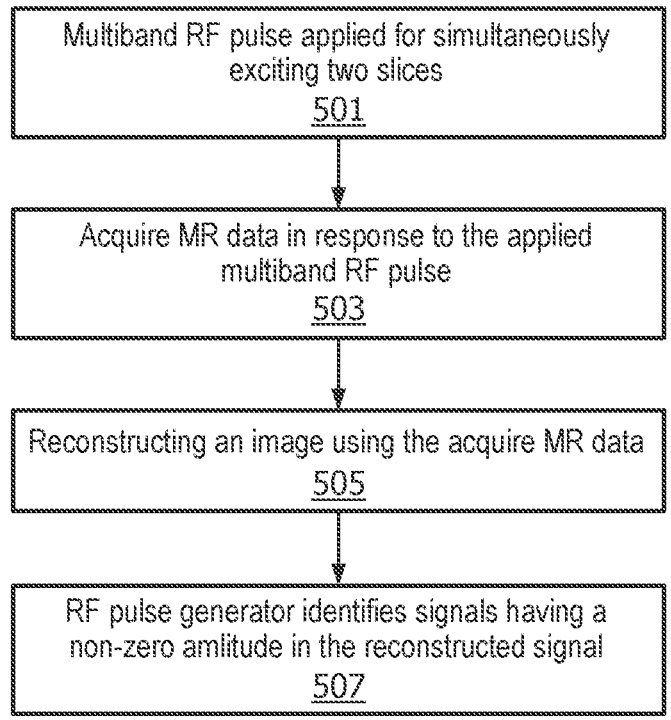
FIG. 5 is a flowchart of an exemplary method for determining a sideband signal.

FIG. 5 is a flowchart of a method for determining the additional signal 309, 401A.

In step 501, the multiband RF pulse may be applied for simultaneously exciting the two slices.

In step 503, MR data may be acquired using the MRI system 100 in response to the applied multiband RF pulse.

In step 505, an image may be reconstructed using the acquired MR data.

In step 507, the RF pulse generator 164 may identify signals having a non-zero amplitude e.g. having an amplitude higher than a predetermined minimum amplitude value, in the reconstructed image. The RF pulse generator 164 may determine the frequency band of the identified signals and compare it with the first and second frequency bands. In case the determined frequency is different (e.g. does not overlap or at least partially overlaps) from the first or second frequency bands the associated signal may be the additional (non-desired sideband) signal.

Figure 6:
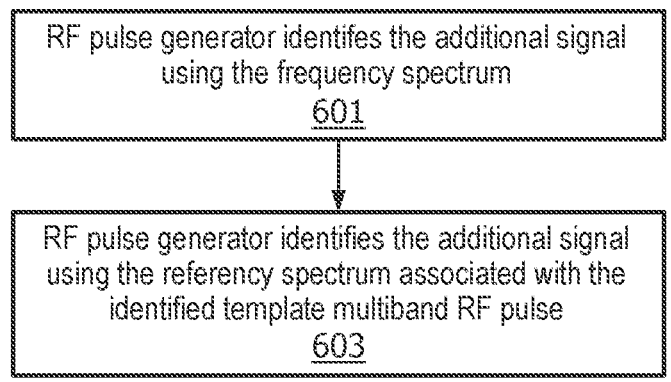
FIG. 6 is a flowchart of another exemplary method for determining a sideband signal.

FIG. 6 is a flowchart of another method for automatically determining the additional signal 309, 401A.

In step 601, the RF pulse generator 164 may identify in the history data 170 a template multiband RF pulse of the one or more multiband RF pulses that corresponds to the multiband RF pulse.

In step 603, the RF pulse generator 164 may identify the additional signal using the frequency spectrum 300 associated with the identified template multiband RF pulse.

LIST OF REFERENCE NUMERALS

100 magnetic resonance imaging system
104 magnet
106 bore of magnet
108 imaging zone
110 magnetic field gradient coils
112 magnetic field gradient coil power supply
114 radio-frequency coil
115 RF amplifier
118 subject
126 computer system
128 hardware interface
130 processor
132 user interface
134 computer storage
136 computer memory
160 control module
164 RF pulse generator
170 history data
300 slice profile
301-305 frequency band
307-308 mainband (main lobe) signals
309-312 sideband (side lobe) signals 313 amplitude
400A-B slice profile
401A-B sideband signal
700 slice profile
701 main lobe signals
703-707 side lobe signals.

The invention claimed is:

1. A method for side-band suppression in a Magnetic Resonance imaging, MRI, system, the method comprising:
   a) providing a first multiband RF pulse for simultaneously exciting at least two slices in a subject at a first and a second frequency band and using the MRI system acquire MR signals from the excited two slices and at least one additional MR signal at a third frequency band, the additional MR signal resulting from a sideband excitation due to the first multiband RF pulse of a slice different from the two slices; and
   b) deriving a pre-compensating term from the first multiband RF pulse and the additional signal, adding the pre-compensating term to the first multiband RF pulse to obtain a second multiband RF pulse, thereby replacing the first multiband RF pulse by the second multiband RF pulse for suppressing at least part of the additional signal upon exciting at least two slices in a subject by the second multiband RF pulse.

2. The method of claim 1, further comprising: repeating the determining of the additional signal and the deriving step c) using the second multiband RF pulse as the first multiband RF pulse in step b) until the suppressed at least part of the additional signal is higher than a predetermined minimum side-band signal amplitude.

3. The method of claim 1, further comprising:
   exciting the at least two slices using the second multiband RF pulse for reconstructing signals from RF coils of the MRI system, wherein reconstructing a signal from an RF coil of the RF coils is performed in accordance with formula $S_q^*(f^*x)_{q,1}$ where: q refers to a slice of the two slices and the additional slice, $S_q$ is a sensitivity of the RF coil for q, f is the normalized measured signal amplitudes of all lobes (main lobes and side lobes representing the main and additional signal components) at q and x is the signal from q.

4. The method of claim 1, wherein determining the additional signal comprises:
   exciting the two slices using the first multiband RF pulse;
   reconstructing an image using acquired MR data for the two slices in response to the first multiband RF pulse; and
   identifying using the reconstructed image the additional signal.

5. The method of claim 1, wherein the MRI system comprises an RF amplifier for amplifying RF pulses generated at the MRI system, wherein determining the additional signal comprises:
   exciting the two slices using the first multiband RF pulse;
   receiving the first multiband RF pulse as the output of the RF amplifier or the output of an RF coil of the MRI system;
   applying a Fourier transformation or a Block simulation to the received first multiband RF pulse for obtaining a frequency spectrum of the received first multiband RF pulse; and
   identifying the additional signal in the frequency spectrum.

6. The method of claim 1, wherein determining the additional signal comprises receiving from a user of the MRI system data indicative of the additional signal being a sideband signal at the third frequency band.

7. The method of claim 1, wherein determining the additional signal comprises:
   providing history data indicative of one or more multiband RF pulses and associated frequency spectrums;
   identifying a multiband RF pulse of the one or more multiband RF pulses that corresponds to the first multiband RF pulse;
   identifying the additional signal using the frequency spectrum associated with the identified multiband RF pulse.

8. The method of claim 4, wherein identifying comprises:
   determining the geometry of the subject;
   using the determined geometry for determining a circumference area around the first and second frequency bands in the frequency spectrum; and
   identifying the additional signal within the circumference area.

9. The method of claim 1, wherein the first multiband RF pulse is defined as $Ae^{i(\phi+2\pi ft)}+Ae^{i(\phi-2\pi ft)}=Ae^{i\phi}\cdot 2\cdot\cos(2\pi f\cdot t)$, wherein the second multiband RF pulse is defined as $Ae^{i\phi}\cdot(2\cdot\cos(2\pi f\cdot t)-h(f,t))$ where $$Ae^{i\phi}\cdot h(f,t)=Ae^{i\phi}\cdot\Sigma_{k=1}^{N}s_k\cos((k)\cdot 2\pi ft+\phi_k)$$

is the pre-compensating term, $s_k$ being a tuning parameter representing the ratio between the amplitude of one of the signals at the first or second frequency band and the amplitude of the additional signal at the third frequency band, (2k)f comprising the third frequency band, $\phi_k$ being the phase difference between the additional signal and one of the signals from the two slices, N determining the number of the at least one additional signal.

10. The method of claim 1, the second multiband RF pulse is defined as $Ae^{i\phi}\cdot g(f,t)\cdot m(f,t)$ where m(f,t) is a harmonic function and $g(f,t)=2\cdot\cos(2\pi\cdot t)$, wherein the Fourier transform of g(f,t)m(f,t) over t gives response close to 1 at f and −f, and close to 0 elsewhere.

11. A computer program product comprising computer executable instructions to perform the method steps of the method of claim 1.

12. A RF pulse generator for a magnetic resonance imaging, MRI, system for side-band suppression, wherein a first multiband RF pulse is provided for simultaneously exciting at least two slices in a subject at a first and a second frequency band and to acquire using the MRI system MR signals from the excited two slices and at least one additional MR signal at a third frequency band, the additional MR signal resulting from a sideband excitation of a slice different from the two slices, the RF pulse generator being configured for using the first multiband RF pulse for determining the additional MR signal; deriving a pre-compensating term from the first multiband RF pulse and the additional signal, adding the pre-compensating term to the first multiband RF pulse to obtain a second multiband RF pulse, thereby replacing the first multiband RF pulse by the second multiband RF pulse for suppressing at least part of the additional MR signal upon exciting at least two slices in a subject by the second multiband RF pulse.

13. A magnetic resonance imaging, MRI, system for acquiring magnetic resonance data comprising an RF pulse generator according to claim 12.

* * * * *